United States Patent
Lignon et al.

(10) Patent No.: US 11,662,207 B2
(45) Date of Patent: May 30, 2023

(54) INERTIAL MEASUREMENT DEVICE

(71) Applicant: SAFRAN ELECTRONICS & DEFENSE, Paris (FR)

(72) Inventors: Christian Lignon, Paris (FR); Philippe Elie, Paris (FR); Sylvain Faure, Paris (FR)

(73) Assignee: SAFRAN ELECTRONICS & DEFENSE, Paris (FR)

( * ) Notice: Subject to any disclaimer, the term of this patent is extended or adjusted under 35 U.S.C. 154(b) by 0 days.

(21) Appl. No.: 17/295,292

(22) PCT Filed: Nov. 20, 2019

(86) PCT No.: PCT/EP2019/081891
§ 371 (c)(1),
(2) Date: May 19, 2021

(87) PCT Pub. No.: WO2020/104507
PCT Pub. Date: May 28, 2020

(65) Prior Publication Data
US 2021/0356274 A1 Nov. 18, 2021

(30) Foreign Application Priority Data
Nov. 20, 2018 (FR) ...................................... 18 71622

(51) Int. Cl.
*G01C 21/16* (2006.01)
*G01C 21/18* (2006.01)
(Continued)

(52) U.S. Cl.
CPC .......... *G01C 21/166* (2020.08); *B81B 7/0003* (2013.01); *B81B 2201/0235* (2013.01); *B81B 2201/0242* (2013.01)

(58) Field of Classification Search
CPC ...... G01C 21/16; G01C 21/18; G01C 21/183; G01C 21/188; G01C 25/005
See application file for complete search history.

(56) References Cited

U.S. PATENT DOCUMENTS 3,509,765 A * 5/1970 Berg ...................... G01C 21/18
73/178 R
2020/0064136 A1* 2/2020 Henderson ............. G01C 21/18

FOREIGN PATENT DOCUMENTS

EP 2239539 A2 10/2010
WO WO-2014/102261 A1 7/2014
WO WO-2014102261 A1 * 7/2014 ............. G01C 21/16

* cited by examiner

*Primary Examiner* — Herbert K Roberts
(74) *Attorney, Agent, or Firm* — Muncy, Geissler, Olds & Lowe, P.C.

(57) ABSTRACT

Inertial measurement apparatus arranged to be carried by a carrier vehicle include a chassis, a turntable mounted on the chassis, a first inertial measurement unit mounted on the turntable and connected to an electronic control unit connected to a motor for controlling turning of the turntable, and a second inertial measurement unit secured to the chassis. The control unit turns the turntable through one revolution with periodic alternating motion from a fixed initial angular position of the turntable. The control unit calculates the acceleration of the carrier vehicle from measuring the first inertial measurement unit while the turntable is stationary and from measuring the second inertial measurement unit while the turntable is moving. The control unit reconstitutes an inertial reference frame for each inertial measurement unit and compares the two inertial reference frames to determine a difference and takes account of this difference when calculating the acceleration.

7 Claims, 2 Drawing Sheets

(51) Int. Cl.
*G01C 25/00* (2006.01)
*B81B 7/00* (2006.01)

INERTIAL MEASUREMENT DEVICE

The present invention relates to the field of inertial measurement, and more particularly to inertial measurement apparatus for mounting in a carrier vehicle in order to determine the movements of the vehicle. The vehicle may be a land, air, or water vehicle, of any type.

TECHNOLOGICAL BACKGROUND

The best known inertial sensors are accelerometers for measuring vector magnitudes and gyros for measuring angular magnitudes. The most commonly used gyros are moving mass rate gyros, in particular in the form of micro-electromechanical systems (MEMS).

An inertial measurement unit generally comprises three rate gyros and three accelerometers arranged on the axes of a measurement reference frame. The accelerometers measure the components of a specific force vector, while the gyros determine the orientation of that vector in the inertial reference frame. Calculating the difference between the specific force vector and the field of gravity provides the acceleration, which is then integrated in order to provide navigation data.

It is known that an inertial measurement unit provides measurements that are affected by errors, such as accelerometer bias, gyro drift, and misalignment error, giving rise to inaccuracy in determining the vertical.

It is known to mount the inertial measurement unit on a turntable that is turned about a substantially vertical axis by a motor connected to the electronic unit so as to be controlled by that electronic unit in such a manner as to bring the inertial measurement unit into a plurality of positions over a complete revolution. By making use of the measurements of the measurement unit in those various positions, it is possible to average out errors by applying a lowpass filter, thereby enabling the accuracy with which the vertical is determined to be improved.

Nevertheless, it is found that when a gyro is turned about an axis that is substantially offset relative to the sensing axis of the gyro, the gyro presents an additional error that leads to a random angular jump during the movement of the gyro. In the long term, the accumulation of the random jumps is equivalent to a defect of the "random walk" type having a component at very low frequency. This type of defect is not averaged out by lowpass filtering and it therefore affects measurement accuracy.

OBJECT OF THE INVENTION

An object of the invention is to improve the accuracy of inertial apparatus.

BRIEF SUMMARY OF THE INVENTION

To this end, according invention, there is provided inertial measurement apparatus arranged to be carried by a carrier vehicle, the apparatus comprising: a chassis, a turntable mounted on the chassis to turn about an axis of rotation (Z) normal to a surface of the turntable, and a first inertial measurement unit that is mounted on said surface of the turntable and that is connected to an electronic control unit connected to a motor for driving the turntable to control turning of the turntable, the first inertial measurement unit comprising three rate gyros ($20x$, $20y$, $20z$) and three accelerometers ($10x$, $10y$, $10z$) arranged on the axes of a first measurement reference frame (R1); the apparatus being characterized in that it comprises a second inertial measurement unit secured to the chassis and comprising three rate gyros and three accelerometers arranged on the axes of a second measurement reference frame (R2), and in that the control unit is arranged:

from a fixed initial angular position of the turntable, to cause the turntable to turn periodically through one revolution with symmetrical go and return movements in order to return the turntable to the fixed initial position;

over a predetermined duration, to calculate the acceleration of the carrier vehicle from:

accelerometer and gyro measurements of the first inertial measurement unit while the turntable is stationary; and accelerometer and gyro measurements of the second inertial measurement unit while the turntable is moving; and to reconstitute an inertial reference frame for each inertial measurement unit from the accelerometer measurements and the gyro measurements measured by said measurement unit during the predetermined duration and to compare the two inertial reference frames in order to determine an orientation difference between them and to take account of this orientation difference when calculating the acceleration on switching from using gyro measurements of the first measurement unit to using gyro measurements of the second measurement unit, and vice versa.

Thus, the calculation of the acceleration is not affected by the above-mentioned defect since it is the measurements from the stationary second inertial measurement unit that are used while the first measurement unit is being moved. Also, when switching from using the measurements of one of the inertial measurement units to using the measurements of the other inertial measurement unit, taking account of the difference between the inertial reference frames of the two inertial measurement units serves to ensure continuity of angular information, at least concerning the plane that is normal to the specific force vector.

It should be recalled that for each inertial measurement unit, the three accelerometers measure the three components of the specific force vector. The "accelerometer measurements" of each inertial unit therefore correspond to the three components of said specific force vector.

Other characteristics and advantages of the invention appear on reading the following description of a particular and nonlimiting embodiment of the invention.

BRIEF DESCRIPTION OF THE DRAWINGS

Reference is made to the accompanying drawings, in which.

DETAILED DESCRIPTION OF THE INVENTION

Figure 1:
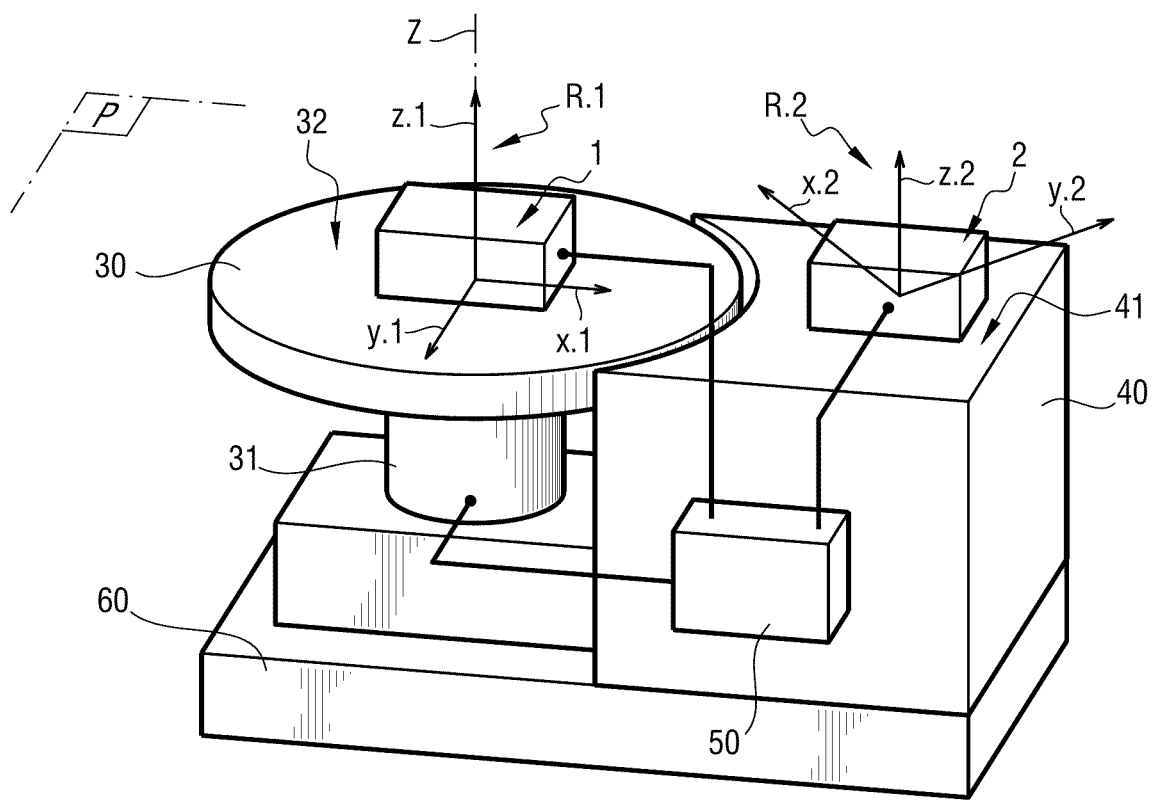
FIG. 1 is a diagrammatic perspective view of apparatus in a first embodiment of the invention.
Figure 2:
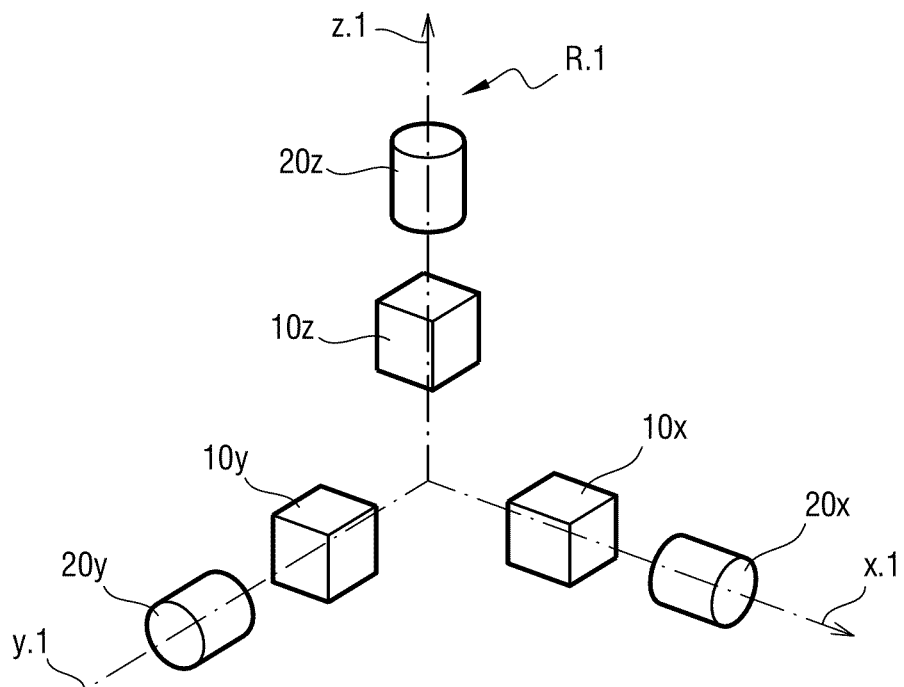
FIG. 2 is a diagrammatic perspective view of one of the inertial measurement units of the apparatus.
Figure 3:
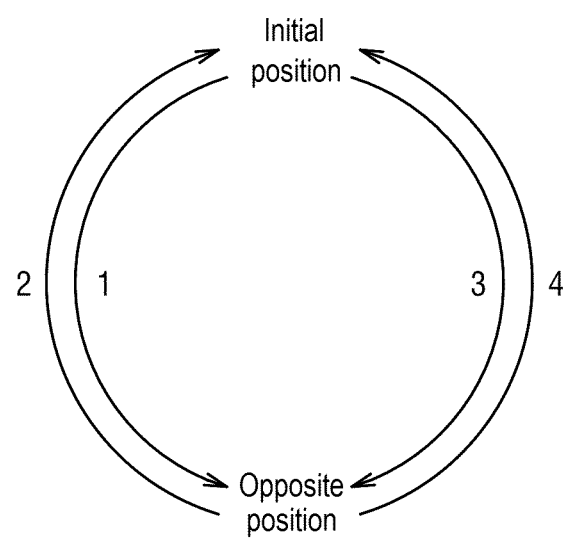
FIG. 3 shows the movements of a peripheral point of the turntable during the movements of the turntable.

With reference to the figures, the apparatus of the invention, that is to be mounted in a carrier vehicle, comprises two inertial measurement units, given overall references 1 and 2, each unit comprising three accelerometers $10x$, $10y$, and $10z$, and three gyros 20x, 20y, and 20z, that are arranged on the axes x.1, y.1, and z.1, and x.2, y.2, and z.2, of respective reference frames R.1 and R.2. The inertial measurement units 1 and 2 are known per se. In particular, in this example, the accelerometers and the gyros are of the MEMS type and they are known per se.

The inertial measurement unit 1 is fastened on a turntable 30, itself mounted on a chassis 40 to pivot about an axis Z that extends vertically in this example and that is normal both to a top surface 32 of the turntable 30 carrying the inertial measurement unit 1 and also to a top surface 41 of the chassis 40. The axis Z.1 of the inertial measurement unit 1 is collinear with the axis Z.

The turntable 30 is turned about the axis Z by a motor 31 that is known per se. The motor 31 is mounted on a stabilizer 60 that is known per se and that is arranged to keep the top surface of the turntable 30 substantially horizontal by accommodating angular movements of the carrier vehicle through about 20° relative to the horizontal plane. In this example, the motor 31 is driven directly, but it could equally well be of the servomotor type.

The inertial measurement unit 2 is fastened on the top surface 41 of the chassis 40. The top surface 41 and the top surface 32 of the turntable 30 lie in the same plane P. Thus, the inertial unit 1 and the second inertial unit 2 are positioned on the same plane P that is perpendicular to the axis of rotation Z.

The inertial measurement units 1 and 2 and the motor 31 are electrically connected to a control unit 50. The control unit 50 comprises an electronic circuit including a processor and memory for executing a positioning computer program including instructions arranged to process the signals coming from the inertial measurement units 1 and 2 in order to provide both the attitude of the carrier vehicle and also its acceleration.

According to the invention, the electronic control unit 50 is programmed:
  from a fixed initial angular position of the turntable 30, to cause the turntable 30 to turn periodically through one revolution with symmetrical go and return movements in order to return the turntable 30 to the fixed initial position;
  over a predetermined duration, to calculate the acceleration of the carrier vehicle from:
    accelerometer and gyro measurements of the first inertial measurement unit 1 while the turntable 30 is stationary; and
    accelerometer and gyro measurements of the second inertial measurement unit 2 while the turntable 30 is moving; and
  to reconstitute an inertial reference frame for each inertial measurement unit from the accelerometer measurements and the gyro measurements measured by said measurement unit during the predetermined duration and to compare the two inertial reference frames in order to determine a difference between them while the turntable 30 is turning and to take account of this difference when calculating the acceleration on switching from using gyro measurements of the first measurement unit 1 to using gyro measurements of the second measurement unit 2, and vice versa.

The control unit 50 is arranged to control the motor 31 in such a manner that the go movement and the return movement include a stop at a predefined intermediate angular position. The motor 31 moves the turntable 30 as follows:
  1. rotation through +180° during a movement time t1 and stop during a stop time t2;
  2. rotation through −180° during the movement time t1 and stop during the stop time t2;
  3. rotation through −180° during the movement time t1 and stop during the stop time t2;
  4. rotation through +180° during the movement time t1 and stop during the stop time t2;
  5. and so on.

By way of example, for a round-trip time t of one minute, the time t1 may be set to 4 seconds and the time t2 may be set to 11 seconds.

The principle on which the inertial reference frames of the two inertial measurement units are compared consists in orienting them relative to each other while using the specific force vector as a reference, and then in projecting onto a plane perpendicular to the specific force vector. It can be understood that taking this difference into account serves to provide continuity for the two angles visible in the plane. The difference between the inertial reference frames can be determined in known manner, and it is preferably determined in accordance with document WO-A-2014/102261.

It should be observed that positioning the two inertial measurement units in the same plane is advantageous since it enables the calculations to be simplified. Specifically if the units are not in the same plane, it would be necessary to make alignment plane corrections between the inertial measurement units (orientation difference and lever arm) in order to match the measurements of both of the inertial measurement units so as to be able to project the measurements of one of the inertial measurement units into the reference frame of the other inertial measurement unit.

Advantageously, the control unit 50 is also programmed to monitor the first inertial measurement unit 1 when the turntable 30 is stationary by calculating an acceleration from the measurements of the second inertial measurement unit 2 and by verifying that it matches the acceleration calculated from the measurements of the first inertial measurement unit 1. If the measurements do not match, then the control unit 50 issues an alert, e.g. to a driver of the carrier vehicle.

Naturally, the invention is not limited to the embodiment described and covers any variant coming within the ambit of the invention as defined by the claims.

In particular, the apparatus may be of a structure different from that described.

The axis of rotation Z need not be vertical.

The movements of the turntable could be different from those described: the number of intermediate positions need not be one; or the movement through 360° could be continuous; or the amplitude of the movement could be other than 360°.

The speed of rotation, the times t1 and t2, and the round-trip time t could be different from those specified. For example, the time t1 could be 2 seconds.

In a variant, if the vehicle is likely to depart significantly from the horizontal (or more generally from the plane P) the stabilized platform 60 is a gimbal platform. Conversely, for a vehicle that is relatively stable relative to the plane P, the chassis could be fastened directly to the vehicle without making use of a stabilized platform.

The electronic control unit 50 could be of a structure other than that described, and by way of example it could be made using a microprocessor, a microcontroller, or a field programmable gate array (FPGA).

The invention claimed is:

1. A method for measuring movement with an inertial measurement apparatus arranged to be carried by a carrier vehicle, comprising: a chassis, a turntable mounted on the chassis to turn about an axis of rotation normal to a surface of the turntable, and a first inertial measurement unit that is mounted on said surface of the turntable and that is connected to an electronic control unit connected to a motor for driving the turntable to control turning of the turntable, the first inertial measurement unit comprising three rate gyros and three accelerometers arranged on the axes of a first measurement reference frame; the apparatus comprising a second inertial measurement unit secured to the chassis and comprising three rate gyros and three accelerometers arranged on the axes of a second measurement reference frame, the method comprising:

from a fixed initial angular position of the turntable, causing the turntable to turn periodically through one revolution with symmetrical go and return movements in order to return the turntable to the fixed initial position;

over a predetermined duration, calculating the acceleration of the carrier vehicle from:
  accelerometer and gyro measurements of only the first inertial measurement unit while the turntable is stationary; and
  accelerometer and gyro measurements of only the second inertial measurement unit while the turntable is moving; and reconstituting an inertial reference frame for each inertial measurement unit from the accelerometer measurements and the gyro measurements measured by said measurement unit during the predetermined duration and comparing the two inertial reference frames in order to determine an orientation difference between them and to take account of this orientation difference when calculating the acceleration on switching from using gyro measurements of the first measurement unit to using gyro measurements of the second measurement unit, and vice versa.

2. The method according to claim 1, comprising monitoring the first inertial measurement unit when the turntable is stationary by calculating acceleration from the measurements of the second inertial measurement unit and by verifying that it matches the acceleration calculated from the measurements of the first inertial measurement unit.

3. The method according to claim 1, wherein the turntable is mounted on a stabilized platform for keeping said surface of the turntable substantially in the same plane while accommodating angular movements of the carrier through 20° relative to said plane.

4. The method according to claim 3, wherein the stabilized platform is a gimbal platform.

5. The method according to claim 1, wherein the axis of rotation of the turntable is vertical.

6. The method according to claim 1, wherein the first inertial unit and the second inertial unit are positioned on the same plane that is perpendicular to the axis of rotation.

7. The method according to claim 1, comprising controlling the motor in such a manner that the go movement and the return movement include a stop at at least one predefined intermediate angular position.

* * * * *